(12) United States Patent
Rhodes et al.

(10) Patent No.: US 6,303,492 B1
(45) Date of Patent: Oct. 16, 2001

(54) EXPANDED IMPLANTATION OF CONTACT HOLES

(75) Inventors: Howard E. Rhodes; Kirk D. Prall; Philip J. Ireland, all of Boise; Kenneth N. Hagen, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/373,101

(22) Filed: Aug. 12, 1999

(51) Int. Cl.⁷ ................................. H01L 21/4763
(52) U.S. Cl. .................. 438/648; 438/555; 438/650; 438/649
(58) Field of Search ................ 438/571, 637, 438/555, 648, 656, 660, 655, 649

(56) References Cited

U.S. PATENT DOCUMENTS

| | | | |
|---|---|---|---|
| 5,232,874 | 8/1993 | Rhodes et al. | 437/195 |
| 5,240,874 | 8/1993 | Roberts | 437/69 |
| 5,885,896 | * 3/1999 | Thakur et al. | 438/649 |
| 5,943,576 | * 3/1999 | Kapoor | 438/302 |

OTHER PUBLICATIONS

"¼–pm LATID (Large–Tilt-angle Implanted Drain) Technology for 3.3–V Operation" Takashi Hori; VLS1 Technology Research Laboratory, Osaka Japan; 1989; pp. 32.4.1–32.4.4.

"A High Density 4M DRAM Process Using Folded Bitline Adaptive Side–Wall Isolated Capacitor (FASIC) Cell"; M. Nagatomo, et al., LSI R and D Lab; Japan; IEDM; 1986; pp. 144–147.

"A New Submicronn MOSFET with LATID (Large–Tilt-angle Implanted Drain) Structure" Takashi Hori et al.; Basic Research Laboratory; Osaka Japan; 1988; pp. 15–16.

"A Practical Trench Isolation Technology with a Novel Planarization Process" G. Fuse et al.; Matsushita Electric Industrial Co., Ltd., Osaka Japan; 1987; pp. 732–735.

Process Integration for 64M DRAM and an Asymmetrical Stacked Trench Capacitor (AST) Cell; K. Sunouchi et al.,; Toshiba Corporation; Kawasaki Japan; 1990; pp. 647–650.

* cited by examiner

Primary Examiner—Caridad Everhart
(74) Attorney, Agent, or Firm—Fletcher, Yoder & Van Someren

(57) ABSTRACT

A method of forming electrical contacts includes the step of implanting ions into a contact hole at an angle to create an enlarged plug enhancement region at the bottom of a contact hole. Thus, even if the contact hole is misaligned, oversized, or over-etched, the enlarged plug enhancement region contains subsequently formed barrier layers and other conductive materials to reduce current leakage into the underlying substrate or into adjacent circuit elements.

42 Claims, 7 Drawing Sheets

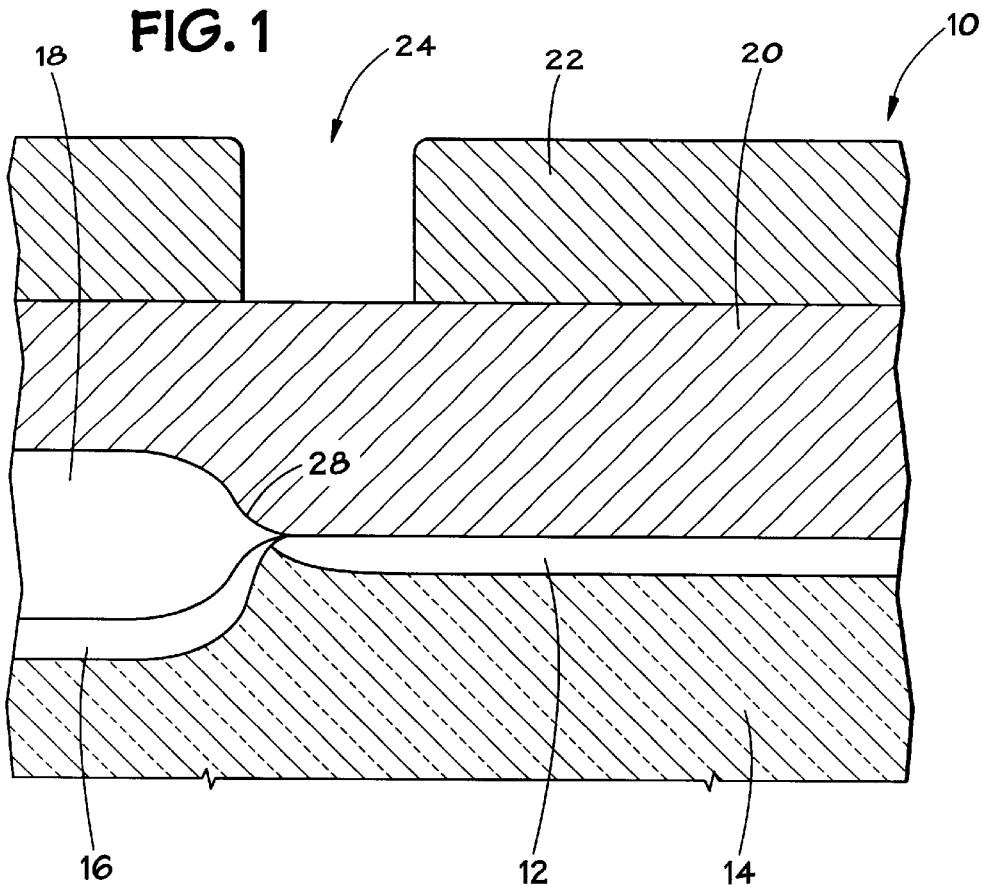
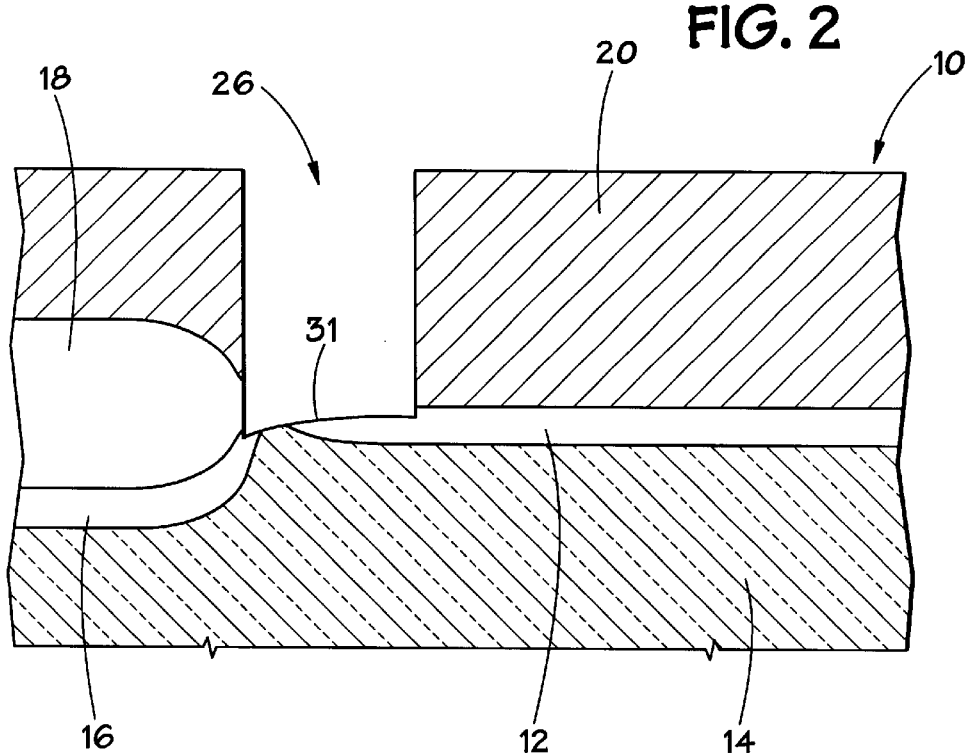

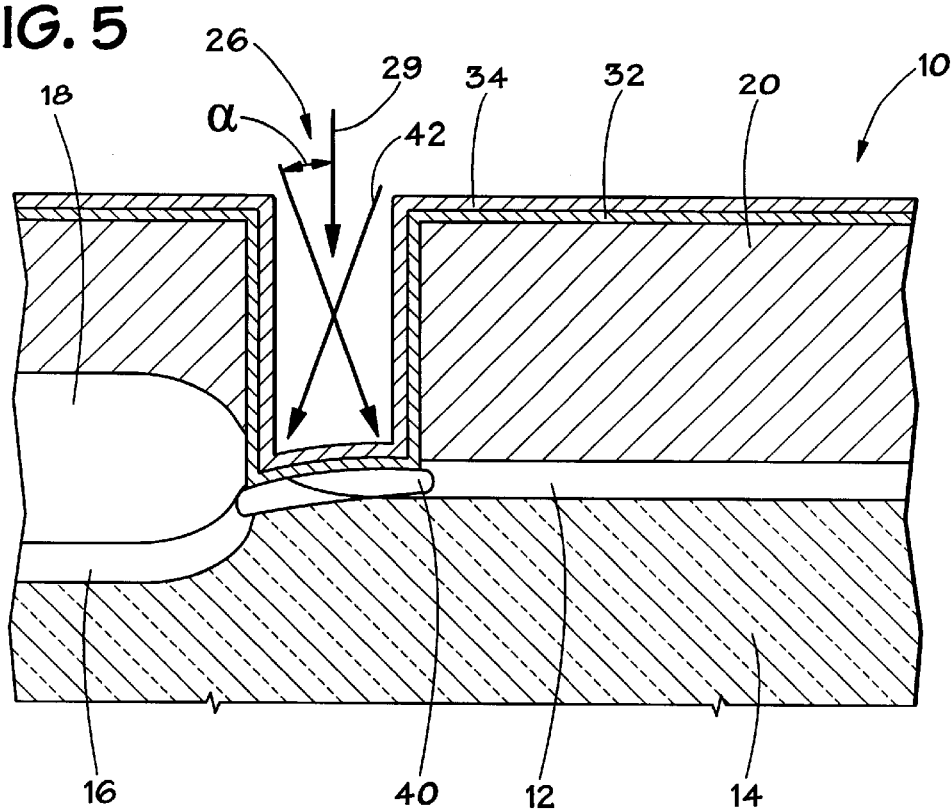
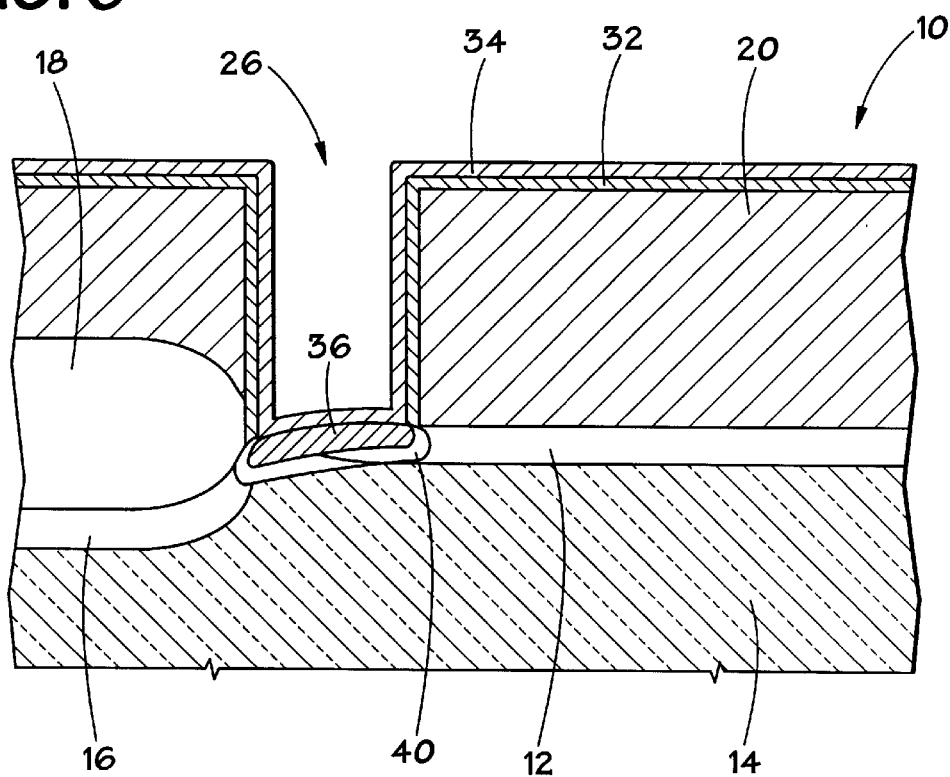

EXPANDED IMPLANTATION OF CONTACT HOLES

BACKGROUND OF THE INVENTION

1. Field of the Invention

The present invention relates generally to the manufacture of integrated circuits and, more particularly, to a method of forming electrical contacts within an integrated circuit.

2. Background of the Related Art

Common to virtually all microelectronic or semiconductor fabrication processes is the need to form conductive paths between different circuit elements that have been fabricated in a die. Contacts and vias are customarily used to interconnect these elements. Contacts and vias are typically fabricated by forming holes between one layer and another and by filling these holes with a conductive material to form a conductive path.

Prior art techniques used to create contacts typically include the following steps: (1) forming a contact hole; (2) implanting a dopant into the bottom of the contact hole; (3) depositing a barrier material, such as titanium, for example, to coat the contact hole's surfaces; (4) annealing the structure; and (5) filling the contact hole with a suitable conductive material. An anisotropic procedure is typically used to etch a contact hole over a selected region of the semiconductor substrate. The contact hole provides an opening through one or several of the semiconductor's insulating layers to the active region or to another conducting layer, such as polysilicon or tungsten silicide. Thus, the contact hole determines the shape and position of the electrical contact that will be formed later in the procedure.

As component packing densities increase, the potential for contact-to-substrate leakage also increases. Here, contact-to-substrate leakage refers to current leakage through the contact fill material to the underlying semiconductor substrate. Two well-known causes of increased contact-to-substrate leakage are: (1) misalignment between the contact hole and the targeted underlying region of the semiconductor and (2) excessive etching during contact hole formation. Both of these problems may lead to increased current leakage and, as a result, reduced circuit performance.

A defect in the placement or depth of a contact hole may impair a contact's performance. Misaligned, over-sized, and over-etched contact holes frequently cause leakage current between the contacts and other structures, such as the underlying substrate. As the density of integrated circuits continues to increase, as it has in the fabrication of static random access memories (SRAMs) and dynamic random access memories (DRAMs), alignment problems have become more troublesome.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention there is provided a method of forming a contact in an integrated circuit. The method includes the steps of: (a) forming an active region in a silicon substrate; (b) forming a layer of dielectric material over the active region in the substrate; (c) forming a contact hole in the layer of dielectric material to expose at least a portion of the active region in the substrate, the contact hole having side walls and a longitudinal axis, and the exposed portion of the substrate forming a bottom surface of the contact hole; (d) implanting a dopant at a positive angle Lo relative to the longitudinal axis to form a plug implantation region in the bottom surface of the contact hole which extends into the substrate beneath the dielectric material adjacent the side walls; (e) depositing a layer of titanium within the contact hole, the layer of titanium coating the side walls and the bottom surface; (f) depositing a layer of titanium nitride over the layer of titanium; (g) annealing the substrate to form a layer of titanium silicide on the bottom surface, the layer of titanium silicide being completely contained within the plug implantation region; and (h) filling the contact hole with a conductive material.

BRIEF DESCRIPTION OF THE DRAWINGS

The foregoing and other advantages of the invention will become apparent upon reading the following detailed description and upon reference to the drawings in which:

FIG. 1 is an exemplary cross-sectional view of a pattern for forming a contact hole which is misaligned with respect to an edge of a field isolation region;

FIG. 2 is an exemplary cross-sectional view of an etched misaligned contact hole;

FIG. 5 is an exemplary cross-sectional view of the misaligned contact hole of FIG. 2 after an angled implantation and after depositions of titanium and titanium nitride;

FIG. 6 is an exemplary cross-sectional view of the misaligned contact hole of FIG. 5 after an annealing operation;

DETAILED DESCRIPTION OF SPECIFIC EMBODIMENTS

Figure 3:
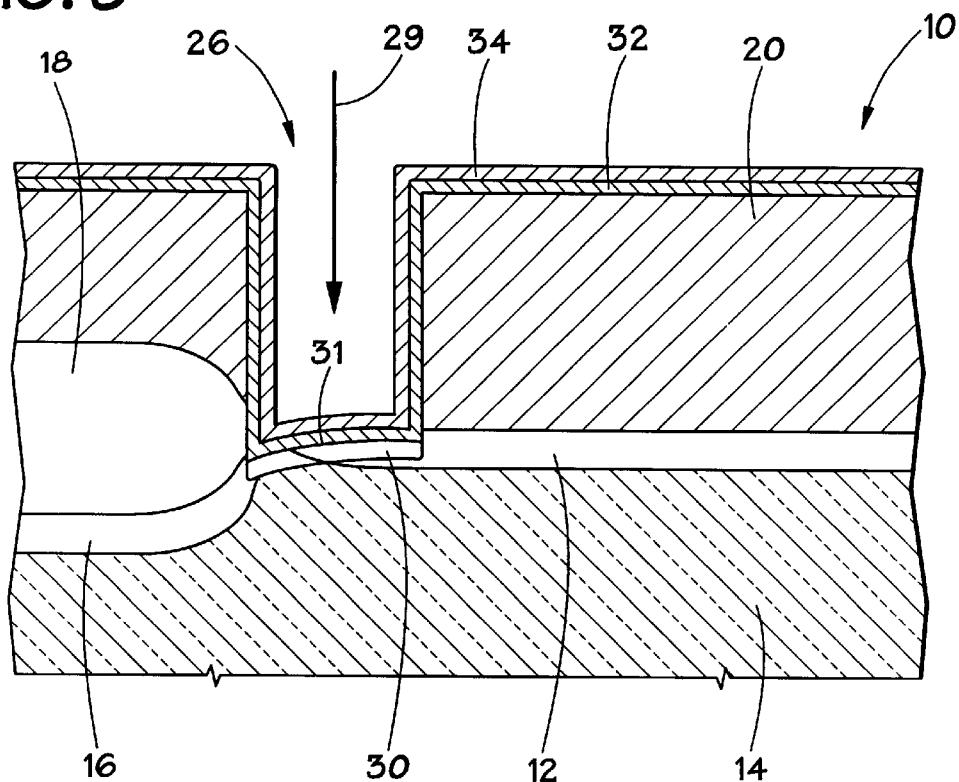
FIG. 3 is an exemplary cross-sectional view of the misaligned contact hole of FIG. 2 after implantation and after depositions of titanium and titanium nitride.

In the interest of clarity, not all features of an actual implantation of an integrated circuit fabrication process are described in the specification. The illustrative embodiments discussed below are restricted to those aspects of an integrated circuit fabrication process related to the formation of a contact hole. Conventional details of integrated circuit fabrication processing, such as mask generation, photoresist development, etching, doping, and cleaning, are not presented because such details are well known in the art of integrated circuit fabrication.

Turning now to the drawings, and referring initially to FIGS. 1 through 4, a portion of an conventional integrated circuit is illustrated during various phases of its fabrication and is generally designated by a reference numeral 10. The integrated circuit 10 may be, for example, a portion of a microprocessor, a semiconductor memory, or any other high density microelectronic device. As can be seen, the portion of the integrated circuit 10 illustrated in FIG. 1 has already progressed through various phases of fabrication. For instance, an active region 12 has been created in a semi-conductive substrate 14, as has a field implant region 16. Over the field implant region 16, a region of field oxide 18 has been created. A layer of dielectric material 20 has been deposited over the field oxide region 18 and the active region 12.

To create a contact hole, a layer of photoresist 22 is deposited over the layer of dielectric material 20. The layer of photoresist material 22 is patterned and etched to create an opening 24 which defines the placement of the contact hole to be created. In the embodiment of the integrated circuit 10 illustrated in FIGS. 1 through 4, it should be noted that the opening 24 has been misaligned. The contact hole should be formed through the layer of dielectric material 20 to expose only a portion of the active region 12. However, as illustrated in FIG. 2, the misalignment of the opening 24 causes the contact hole 26 to be etched into a portion of the field oxide region 18 and into a portion of the field implant region 16 as well.

The field oxide region 18 and the field implant region 16 electrically isolate the active region 12 from other adjacent active regions. For instance, in the case of a semiconductor memory, the field oxide region 18 and the field implant region 16 electrically isolate a memory cell to be formed over the active region 12 from other memory cells in the semiconductor memory. Because the bird's beak 28 formed by the ends of the field oxide region 18 and the field implant region 16 marks the end of the insulating effect provided by these regions, the removal of the bird's beak 28 due to the misaligned contact hole 26 reduces the insulating effect of the field oxide region 18 and the field implant region 16. Also, the misalignment of the contact hole 26 creates a short circuit to the field implant region 16, which results in current leakage into the field implant region 16. Furthermore, the misalignment of the contact hole 26 also reduces the surface area of the active region 12 which will be placed in contact with conductive material used to fill the contact hole 26. This may increase the resistance or reduce the overall current carrying ability of the subsequently formed contact.

Figure 4:
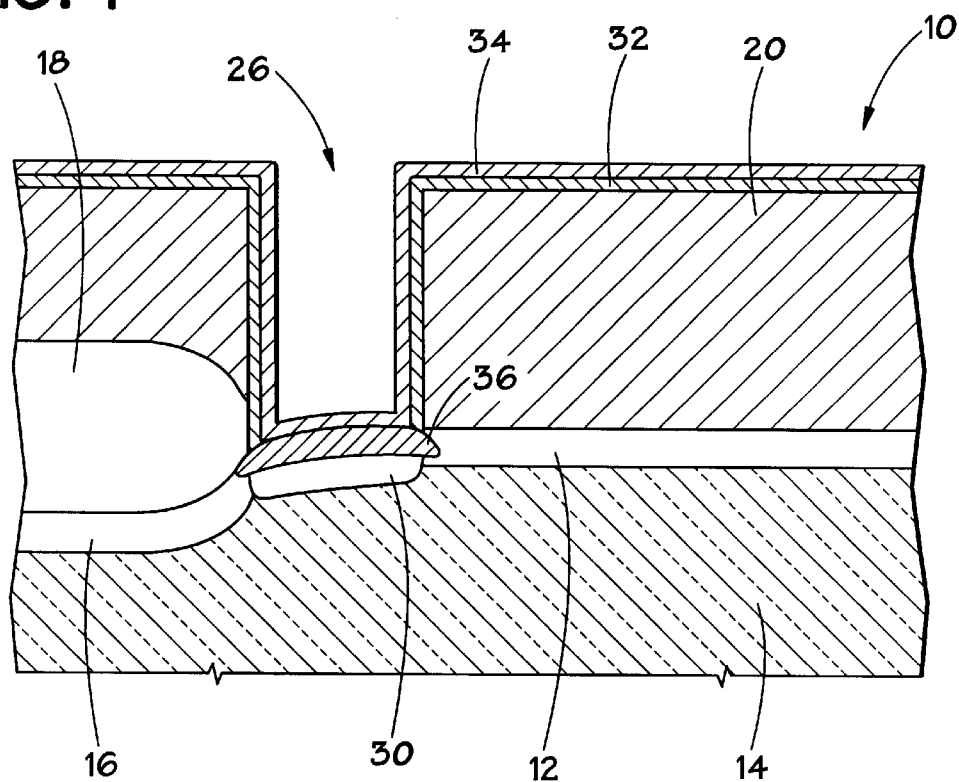
FIG. 4 is an exemplary cross-sectional view of the misaligned contact hole of FIG. 3 after an annealing operation.

The particular problems created by this misalignment may be demonstrated with reference to FIGS. 3 and 4, which illustrate the integrated circuit 10 after further processing steps are performed prior to filling the contact hole 26 with a conductive material to form the contact. Referring first to FIG. 3, the bottom of the contact hole 26 is doped using an implantation procedure that is vertically aligned with the contact hole 26. In other words, the implanted ions travel along a trajectory that is generally parallel to the longitudinal axis 29 of the contact hole 26, which is generally parallel to the side walls and perpendicular to the bottom of the contact hole 26. This doped region is typically referred to a plug implant, which is designated by a reference numeral 30. As discussed below, the plug implant is typically performed prior to the deposition of a contact layer.

The plug implantation procedure typically uses the same charge carrier as the underlying active region 12. Thus, if the active region 12 is n-type, an n-type species, such as phosphorous or arsenic, is used to form the plug implant 30. Similarly, if the active region 12 is a p-type region, a p-type species, such as boron, is used form the plug implant region 30. Furthermore, it should be understood that although a single plug implantation is illustrated in this embodiment, a multiple plug implantation operation may also be used where the dopants are implanted using different energies, species, doses, etc.

As can be seen in FIG. 3, the plug implant region 30 extends from the bottom surface 31 of the contact hole 26 into the active region 12 of the substrate 14. The layer of dielectric material 20 masks the remainder of the substrate 14, so the plug implant region 30 does not extend under the layer of dielectric material adjacent the side walls of the contact hole 26. However, because of the misalignment of the contact hole 26, the plug implant region 30 does extend into a portion of the field oxide region 18 and the field implant region 16.

Following the formation of the plug implant region 30, one or more contact or barrier layers may be formed. A contact layer is typically formed to enhance the electrical contact between the subsequently deposited conductive material and the plug implant 30, and a barrier layer is typically formed to prevent the conductive material from diffusing into the plug implant 30. As illustrated in FIG. 3, a thin layer 32 of contact material is formed on the substrate to coat the contact hole 26. The formation of a layer of titanium is advantageous because it reacts with the silicon substrate to form titanium silicide, as discussed below. After the formation of the contact layer 32, a second layer 34 of barrier material may be deposited, such as titanium nitride, for instance.

The layers 32 and 34 may be formed using physical vapor deposition or chemical vapor deposition, for example. In the case of physical vapor deposition, the upper titanium nitride layer may be deposited by sputtering using a target containing titanium nitride, or it may be deposited by sputtering using a titanium target in an atmosphere containing nitrogen. Alternatively, the upper titanium nitride layer may be formed by the introduction of nitrogen or ammonia during an anneal process to produce a surface reaction with the bottom titanium layer 32.

After the layers 32 and 34 have been deposited, the integrated circuit 10 is subjected to an annealing operation. As illustrated in FIG. 4, the annealing operation causes activation of the dopant used to create the plug implant 30, and it also forms a layer of titanium silicide 36 due to the reaction between the titanium layer 32 and the silicon substrate 14. Furthermore, the annealing operation forms a better electrical contact between the contact layer 32 and the underlying active region 12, as well as improving the adhesion characteristics between the barrier layer 34 and the subsequently deposited conductive material.

As mentioned above, the plug implant region 30 extends out of the active region 12 and into a portion of the field implant region 16 and the field oxide region 18 due to the misalignment. During the annealing operation, the layer of titanium silicide 36 grows so that it not only covers the bottom surface of the contact hole 26, but so that it also can extend outside of the plug implant region 30. In fact, the layer of titanium silicide 36 grows into the field implant region 16 and creates a leakage path that will carry current to the substrate during operation of the finished integrate circuit.

FIGS. 5 and 6 illustrate one embodiment which reduces the leakage current caused by misaligned contact holes. Because this example involves a misaligned contact hole, the reference numerals used thus far will continue to be used to designate similar elements. Referring first to FIG. 5, a plug implant region 40 is formed in the misaligned contact hole 26. As with the previous example mentioned above, the plug implant region 40 is formed by ion implantation using the same type of ions, i.e., P-type or N-type, present in the active region 12 of the substrate 14.

However, unlike the previous example, the implantation procedure involves bombarding the contact hole 26 with ions having trajectories that are angled relative to the axis 29 of the contact hole 26. These angled trajectories are illustrated by the arrows 42 which form an angle a with the axis 29. The angle a may be between 0.1 degrees and 30.0 degrees, and is advantageously about 5 to 7 degrees. The ions may be implanted at a single angle or at multiple angles. Also, the angled implants may be used in conjunction with perpendicular implants as well.

During implantation, the integrated circuit 10 may be rotated so that the contact hole 26 is rotated generally about the axis 29 to ensure that all portions of the bottom surface of the contact hole 26 receive the angled ions. Alternatively, the angle of implantation may be selectively changed during implantation to produce the plug enhancement region 40. For example, the relative rotation may be continuous and ranges from one to ten revolutions per implant. Alternatively, the rotation may be intermittent with four stop points at n, n+90°, n+180°, and n+270°.

By using this angled implantation method, the plug implant region 40 not only extends into the active region 12 of the substrate 14, as well as the field oxide region 18 and the field implant region 16, but it also extends beneath the layer of dielectric material 20 adjacent the side walls of the contact hole 26. Thus, this method creates an expanded plug implant region 40 as compared with the conventional plug implant region 30.

Subsequent to the implantation which forms the plug implant 40, one or more contact or barrier layers may be deposited. In this embodiment, the contact layer 32 may be titanium, and the barrier layer 34 may be titanium nitride, as discussed previously. The integrated circuit 10 is then subjected to an annealing operation to form a layer of titanium silicide and to activate the dopants in the plug implant 40. As illustrated in FIG. 6, because the plug implant 40 is wider than the lateral dimension of the contact hole 26, the layer of titanium silicide 36 formed during the annealing operation is entirely contained within the angled plug implant region 40. Because the plug implant 40 has essentially expanded the active region 12 to contain the layer of silicide 36 as it grows, the layer of silicide 36 does not contact the field implant region 16 to create a short circuit which would cause current leakage during operation of the subsequently formed contact.

Figure 7:
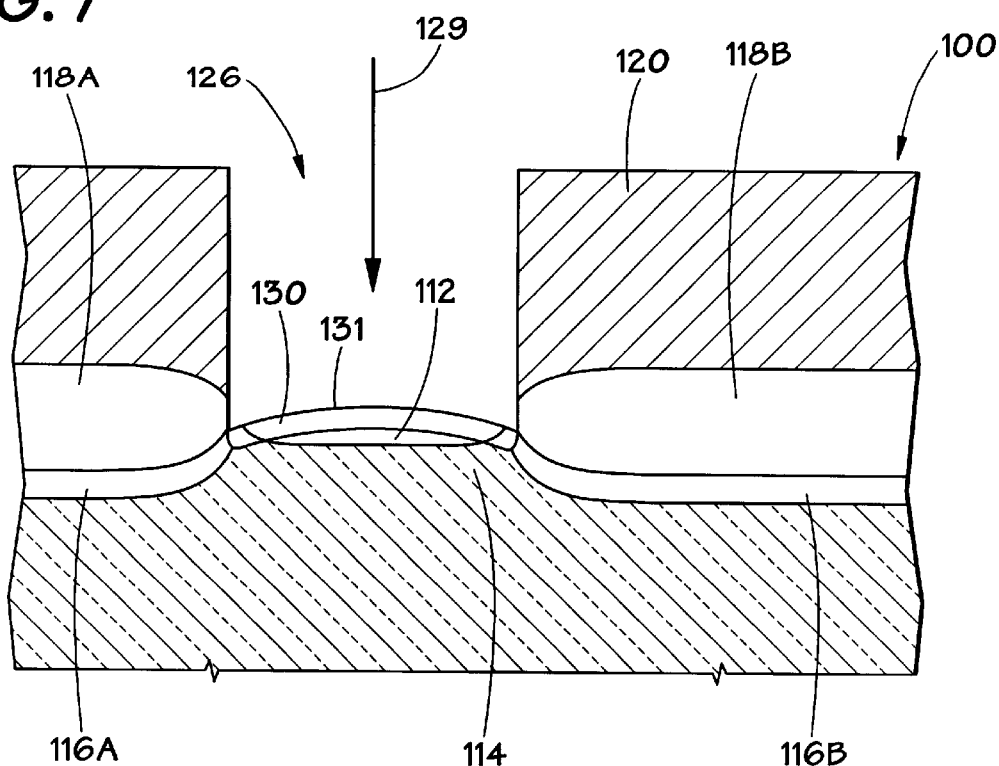
FIG. 7 is an exemplary cross-sectional view of an over-sized contact hole.
Figure 8:
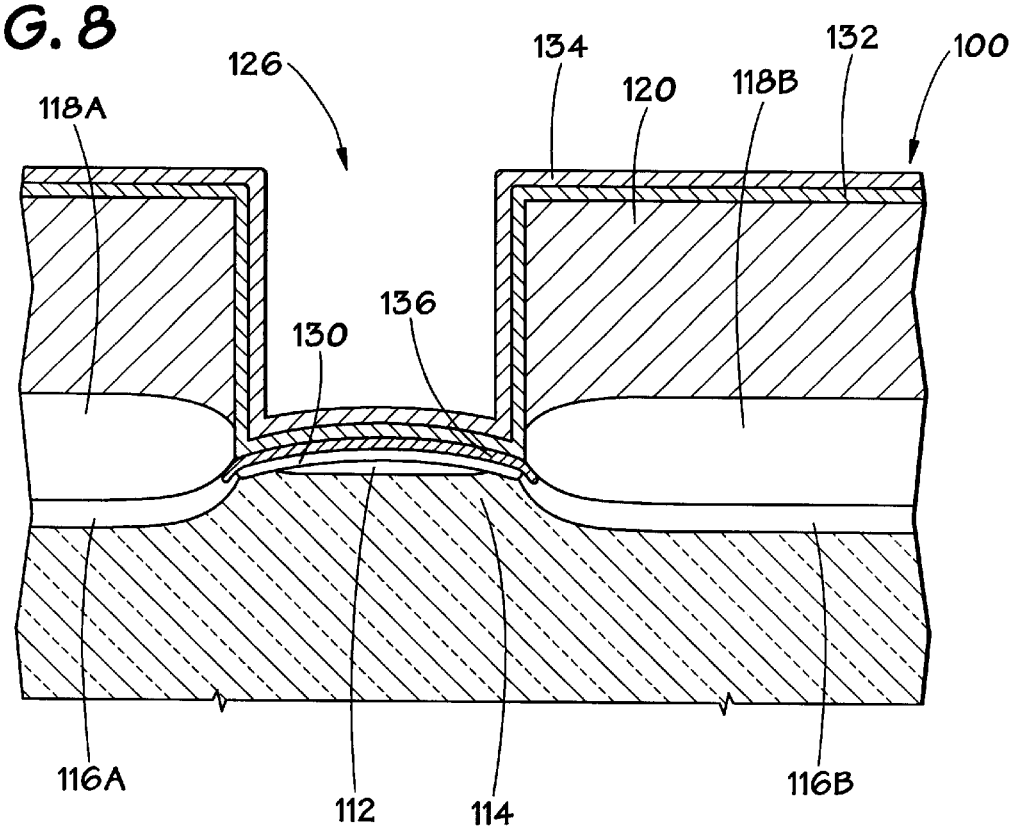
FIG. 8 is an exemplary cross-sectional view of the over-sized contact hole of FIG. 7 after implantation, after depositions of titanium and titanium nitride, and after an annealing operation.

FIGS. 7 and 8 illustrate the problem of over-sized contact windows. These figures present a portion of an conventional integrated circuit during various phases of its fabrication, which is generally designated by a reference numeral 100. The integrated circuit 100 may be, for example, a portion of a microprocessor, a semiconductor memory, or any other high density microelectronic device. As can be seen, the portion of the integrated circuit 100 illustrated in FIG. 7 has already progressed through various phases of fabrication. For instance, an active region 112 has been created in a semiconductive substrate 114, as has field implant regions 116A and 116B. Over the field implant regions 116A and 116B, regions of field oxide 118A and 118B have been created. A layer of dielectric material 120 has been deposited over the field oxide regions 118A and 118B and the active region 112, and a contact hole 126 has been formed through the layer of dielectric material 120.

As previously mentioned, the contact hole 126 should be formed through the layer of dielectric material 120 to expose only a portion of the active region 112. However, as illustrated in FIG. 7, the contact hole 126 is over-sized as compared to the active region 112, so it has been etched into a portion of the field oxide regions 118A and 118B and into a portion of the field implant regions 116A and 116B as well.

The field oxide regions 118A and 118B and the field implant regions 116A and 116B electrically isolate the active region 112 from other adjacent active regions. Because the bird's beaks formed by the ends of the field oxide regions 118A and 118B and the field implant regions 116A and 116B mark the end of the insulating effect provided by these regions, the removal of the bird's beaks due to the over-sized contact hole 126 reduces the insulating effect of the field oxide regions 118A and 118B and the field implant regions 116A and 116B. Also, the size of the contact hole 126 creates a short circuit to the field implant regions 116A and 116B, which results in current leakage into the field implant regions 116A and 116B.

Referring still to FIG. 7, the bottom of the contact hole 126 is doped using an implantation procedure that is vertically aligned with the contact hole 126. In other words, the implanted ions travel along a trajectory that is generally parallel to the longitudinal axis 129 of the contact hole 126, which is generally parallel to the side walls and perpendicular to the bottom of the contact hole 126. This doped region is typically referred to a plug implant, which is designated by a reference numeral 130. The plug implantation procedure typically uses the same charge carrier as the underlying active region 112. Furthermore, it should be understood that although a single plug implantation is illustrated in this embodiment, a multiple plug implantation operation may also be used where the dopants are implanted using different energies, species, doses, etc.

As can be seen in FIG. 7, the plug implant region 130 extends from the bottom surface 131 of the contact hole 126 into the active region 112 of the substrate 114. The layer of dielectric material 120 masks the remainder of the substrate 114, so the plug implant region 130 does not extend under the layer of dielectric material adjacent the side walls of the contact hole 126. However, because of the over-sized nature of the contact hole 126, the plug enhancement region 130 does extend into a portion of the field oxide regions 118A and 118B and the field implant regions 116A and 116B.

Following the formation of the plug implant region 130, one or more layers may be formed. As illustrated in FIG. 8, a thin layer 132 of contact material, such as titanium, is formed on the substrate to coat the contact hole 126. After the formation of the first layer 132, a second layer 134 of barrier material, such as titanium nitride, may be deposited, as discussed previously.

After the layers 132 and 134 have been deposited, the integrated circuit 100 is subjected to an annealing operation. As illustrated in FIG. 8, the annealing operation causes activation of the dopant used to create the plug implant 130, and it also forms a layer of titanium silicide 136 due to the reaction between the titanium layer 132 and the silicon substrate 114. However, as in the previous example, the plug implant region 130 extends out of the active region 112 and into a portion of the field implant regions 116A and 116B and the field oxide regions 118A and 118B due to the size of the contact hole 126. During the annealing operation, the layer of titanium silicide 136 grows isotropically so that it not only covers the bottom surface of the contact hole 126, but so that it also extends outside of the plug enhancement region 130. In fact, the layer of titanium silicide 136 grows into the field implant regions 116A and 116B and creates a leakage path that will carry current to the substrate during operation of the finished integrate circuit.

Figure 9:
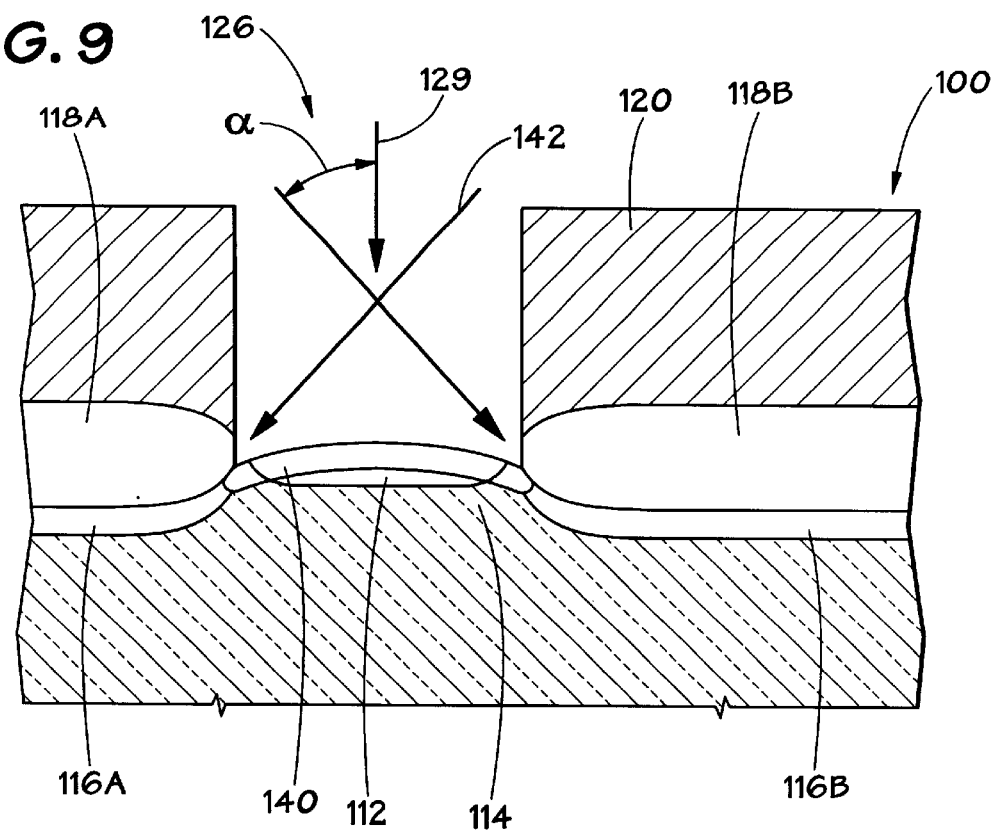
FIG. 9 is an exemplary cross-sectional view of the over-sized contact hole of FIG. 7 after an angled implantation.
Figure 10:
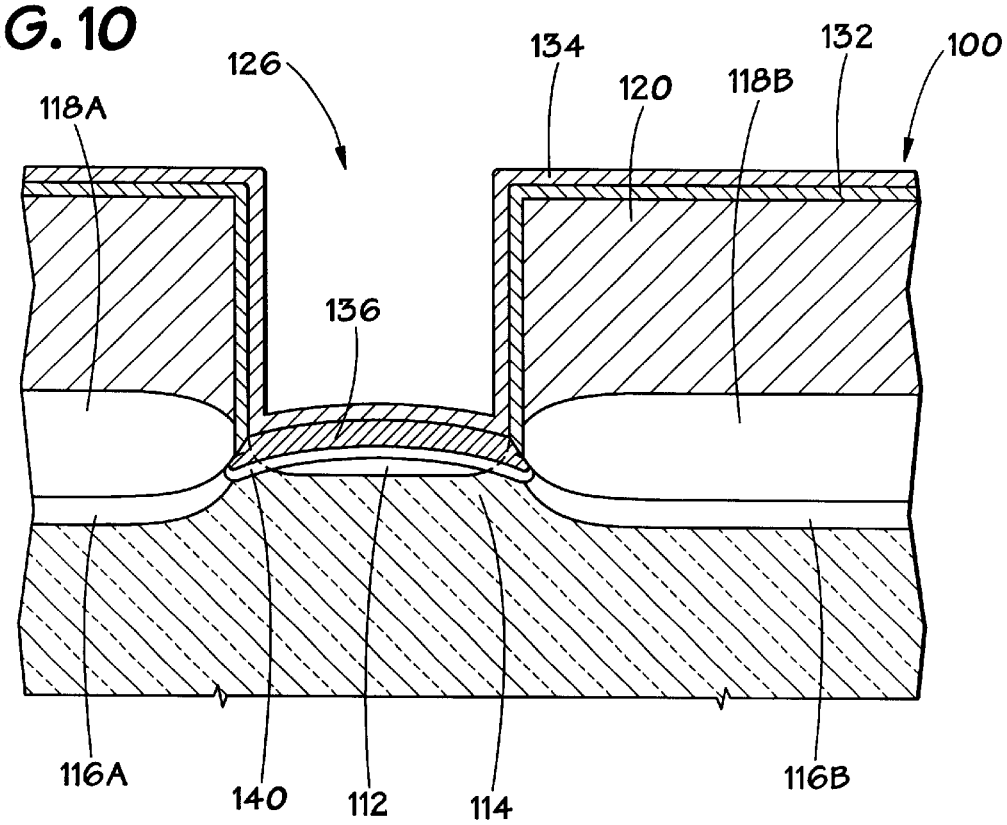
FIG. 10 is an exemplary cross-sectional view of the over-sized contact hole of FIG. 9 after depositions of titanium and titanium nitride and after an annealing operation.

FIGS. 9 and 10 illustrate another embodiment which reduces the leakage current caused by over-sized contact holes. Because this example involves an over-sized contact hole, the reference numerals used in FIGS. 7 and 8 will continue to be used to designate similar elements. Referring first to FIG. 9, a plug implant region 140 is formed in the over-sized contact hole 126. Like the example set forth in FIGS. 7 and 8, the plug implant region 140 is formed by ion implantation using the same type of ions, i.e., P-type or N-type, present in the active region 112 of the substrate 114.

However, unlike the previous example, the implantation procedure involves bombarding the contact hole 126 with ions having trajectories that are angled relative to the axis 129 of the contact hole 126. These angled trajectories are illustrated by the arrows 142 which form an angle a with the axis 129. The angle a may be between 0.1 degrees and 30.0 degrees, and is advantageously about 5 to 7 degrees. The ions may be implanted at a single angle or at multiple angles. Also, the angled implants may be used in conjunction with perpendicular implants as well.

During implantation, the integrated circuit 100 may be rotated so that the contact hole 126 is rotated generally about the axis 129 to ensure that all portions of the bottom surface of the contact hole 126 receive the angled ions. Alternatively, the angle of implantation may be selectively changed during implantation to produce the plug implant region 140. For example, the relative rotation may be continuous and ranges from one to ten revolutions per implant. Alternatively, the rotation may be intermittent with four stop points at n, n+90°, n+180°, and n+270°.

By using this angled implantation method, the plug implant region 140 not only extends into the active region 112 of the substrate 114, as well as the field oxide regions 118A and 118B and the field implant regions 116A and 116B, but it also extends beneath the layer of dielectric material 120 adjacent the side walls of the contact hole 126. Thus, this method creates an expanded plug implant region 140 as compared with the conventional plug implant region 130.

Subsequent to the implantation which forms the plug implant 140, one or more layers may be deposited, as illustrated in FIG. 10. In this embodiment, the first layer 132 may be titanium, and the second layer 134 may be titanium nitride, as discussed previously. The integrated circuit 100 is then subjected to an annealing operation to form a layer of titanium silicide and to activate the dopants in the plug implant 140. Because the plug implant 140 is wider than the lateral dimension of the contact hole 124, the layer of titanium silicide 136 formed during the annealing operation is entirely contained within the angled plug implant region 140. Because the plug enhancement 140 has essentially expanded the active region 12 to contain the layer of silicide 136 as it grows, the layer of silicide 136 does not contact the field implant region 116 to create a short circuit which would cause current leakage during operation of the subsequently formed contact.

Figure 11:
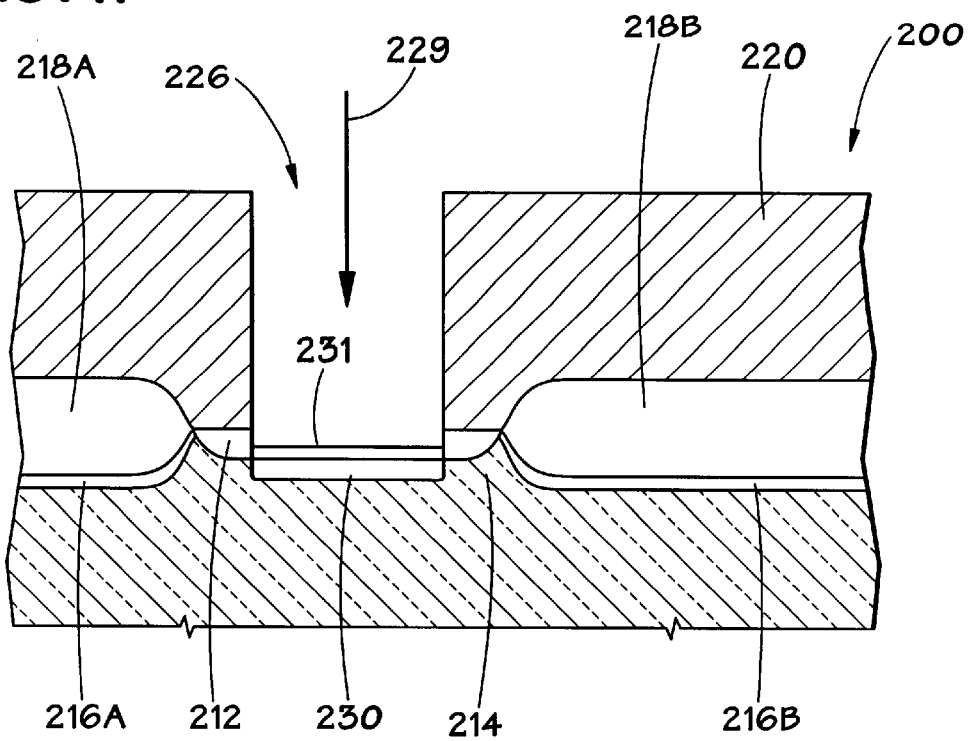
FIG. 11 is an exemplary cross-sectional view of an over-etched contact hole.
Figure 12:
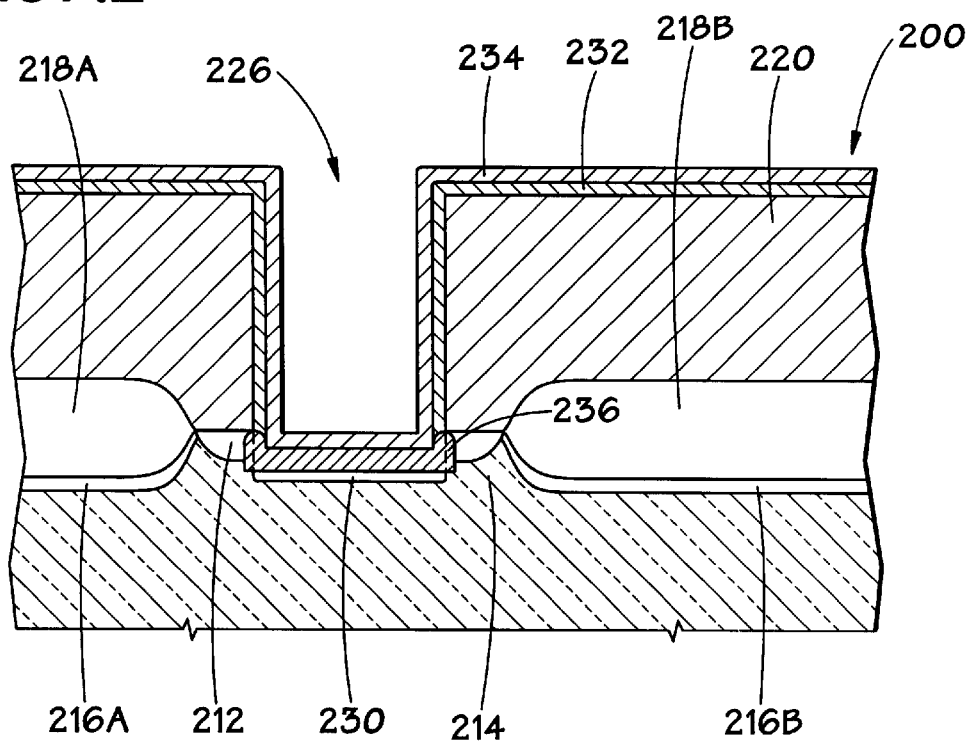
FIG. 12 is an exemplary cross-sectional view of the over-etched contact hole of FIG. 11 after implantation, after depositions of titanium and titanium nitride, and after an annealing operation.

FIGS. 11 and 12 illustrate the problem caused by over-etched contact holes. These figures illustrate a portion of an conventional integrated circuit during various phases of its fabrication, which is generally designated by a reference numeral 200. Again, the integrated circuit 200 may be, for example, a portion of a microprocessor, a semiconductor memory, or any other high density microelectronic device. As can be seen, the portion of the integrated circuit 200 illustrated in FIG. 11 has already progressed through various phases of fabrication. For instance, an active region 212 has been created in a semiconductive substrate 214, as has field implant regions 216A and 216B. Over the field implant regions 216A and 216B, regions of field oxide 218A and 218B have been created. A layer of dielectric material 220 has been deposited over the field oxide regions 218A and 218B and the active region 212, and a contact hole 226 has been formed in the layer of dielectric material 220. The contact hole should be formed through the layer of dielectric material 220 to expose only a portion of the active region 212. However, as illustrated in FIG. 11, the contact hole 226 has been over-etched so that a portion of the active region 212 has been removed as well.

The particular problems created by this over-etching may be demonstrated with reference to FIG. 12, which illustrates the integrated circuit 200 after further processing steps are performed prior to filling the contact hole 226 with a conductive material to form the contact. The bottom of the contact hole 226 is doped using an implantation procedure that is vertically aligned with the contact hole 226. In other words, the implanted ions travel along a trajectory that is generally parallel to the longitudinal axis 229 of the contact hole 226, which is generally parallel to the side walls and perpendicular to the bottom of the contact hole 226. This doped region forms a plug implant 230. The plug implantation procedure typically uses the same charge carrier as the underlying active region 212. Furthermore, it should be understood that although a single plug implantation is illustrated in this embodiment, a multiple plug implantation operation may also be used where the dopants are implanted using different energies.

As can be seen in FIG. 11, the plug implant region 230 extends from the bottom surface 231 of the contact hole 226, through the active region 212, and into the bulk substrate 214. The layer of dielectric material 220 masks the remainder of the substrate 214, so the plug implant region 230 does not extend under the layer of dielectric material adjacent the side walls of the contact hole 226.

Following the formation of the plug implant region 230, one or more layers may be formed. As illustrated in FIG. 12, a thin layer 232 of contact material, such as titanium, is formed on the substrate to coat the contact hole 226. After the formation of the first layer 232, a second layer 234 of barrier material, such as titanium nitride, may be deposited. After the layers 232 and 234 have been deposited, the integrated circuit 200 is subjected to an annealing operation. As illustrated in FIG. 12, the annealing operation causes activation of the dopant used to create the plug enhancement 230, and it also forms a layer of titanium silicide 236 due to the reaction between the titanium layer 232 and the silicon substrate 214.

As mentioned above, the plug implant region 230 extends through the active region 212 and into the bulk substrate 214 due to the over-etching. During the annealing operation, the layer of titanium silicide 236 grows isotropically so that it not only covers the bottom surface of the contact hole 226, but so that it also extends outside of the plug implant region 230. In fact, the layer of titanium silicide 236 grows into the bulk substrate 214 and creates a leakage path that will carry current to the substrate during operation of the finished integrate circuit.

Figure 13:
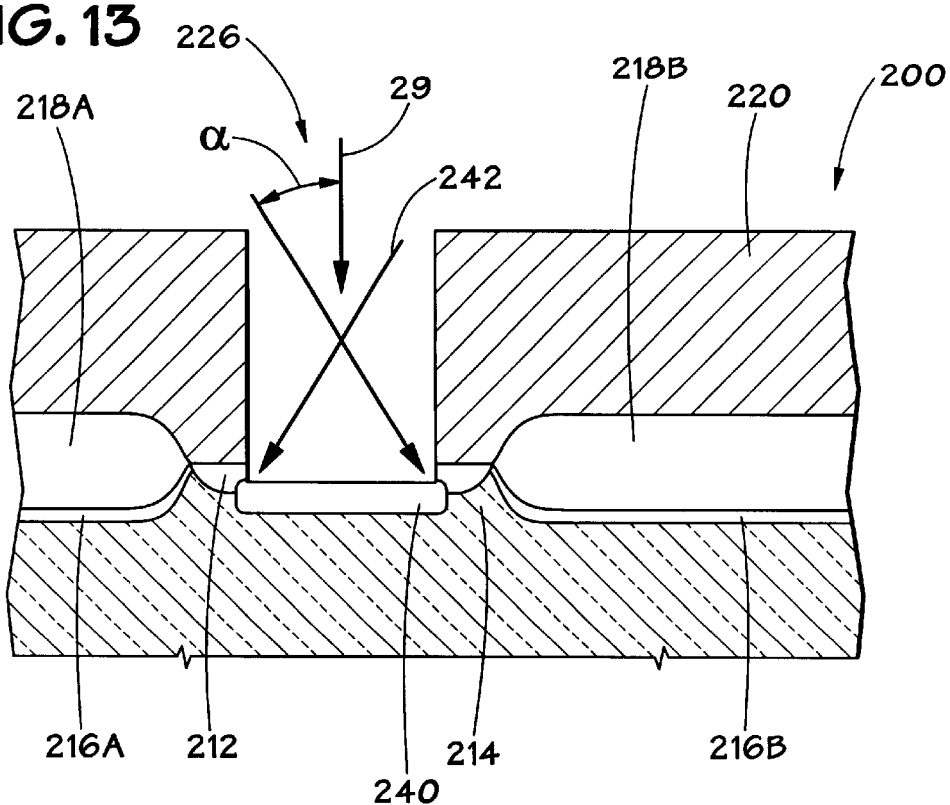
FIG. 13 is an exemplary cross-sectional view of an over-etched contact hole after an angled implantation.
Figure 14:
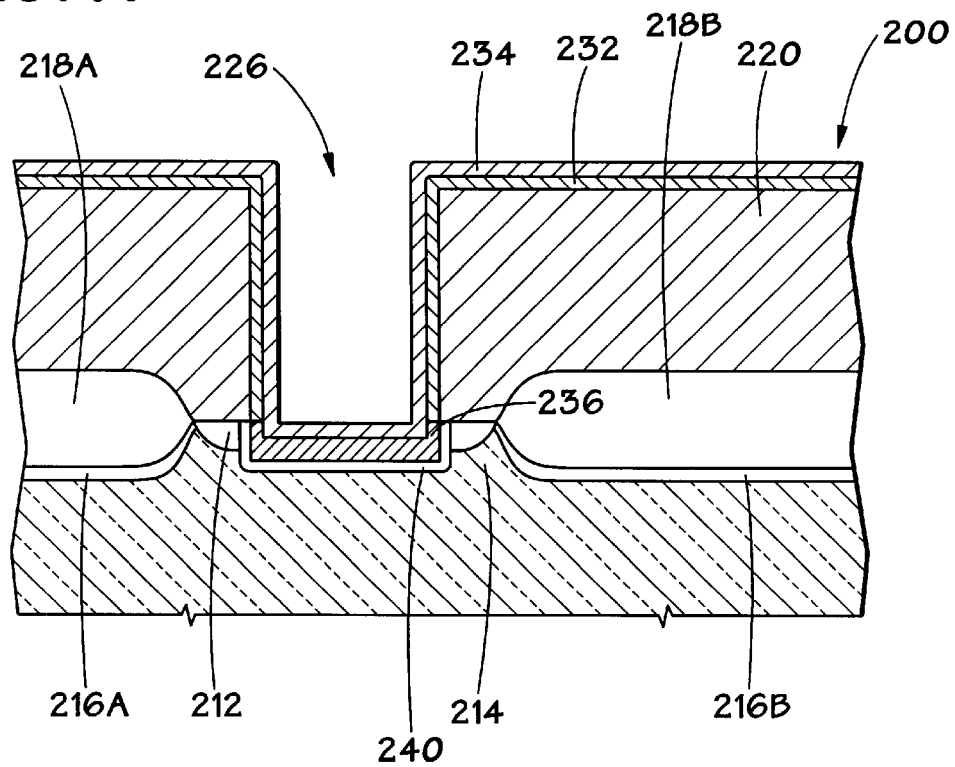
FIG. 14 is an exemplary cross-sectional view of the over-etched contact hole of FIG. 13 after depositions of titanium and titanium nitride and after an annealing operation.

FIGS. 13 and 14 illustrate another embodiment which reduces the leakage current caused by over-etched contact holes. Because this example involves an over-etched contact hole, the reference numerals used in FIGS. 11 and 12 will continue to be used to designate similar elements. Referring first to FIG. 13, a plug implant region 240 is formed in the over-etched contact hole 226. As with the example mentioned above, the plug implant region 240 is formed by ion implantation using the same type of ions, i.e., P-type or N-type, present in the active region 212 of the substrate 214.

However, unlike the previous example, the implantation procedure involves bombarding the contact hole 226 with ions having trajectories that are angled relative to the axis 229 of the contact hole 226. These angled trajectories are illustrated by the arrows 242 which form an angle a with the axis 229. The angle a may be between 0.1 degrees and 30.0 degrees, and is advantageously about 5 to 7 degrees. The ions may be implanted at a single angle or at multiple angles. Also, the angled implants may be used in conjunction with perpendicular implants as well.

During implantation, the integrated circuit 200 may be rotated so that the contact hole 226 is rotated generally about the axis 229 to ensure that all portions of the bottom surface of the contact hole 226 receive the angled ions. Alternatively, the angle of implantation may be selectively changed during implantation to produce the plug implant region 240. For example, the relative rotation may be continuous and ranges from one to ten revolutions per implant. Alternatively, the rotation may be intermittent with four stop points at n, n+90°, n+180°, and n+270°.

By using this angled implantation method, the plug implant region 240 not only extends through the active region 212 of the substrate 214, it also extends beneath the layer of dielectric material 220 adjacent the side walls of the contact hole 226. Thus, this method creates an expanded plug implant region 240 as compared with the conventional plug implant region 230.

Subsequent to the implantation which forms the plug implant 240, one or more contact or barrier layers may be deposited. In this embodiment, the first contact layer 232 may be titanium, and the second barrier layer 234 may be titanium nitride, as discussed previously. The integrated circuit 200 is then subjected to an annealing operation to form a layer of titanium silicide and to activate the dopants in the plug implant 240. As illustrated in FIG. 14, because the plug implant 240 is wider than the lateral dimension of the contact hole 224, the layer of titanium silicide 236 formed during the annealing operation is entirely contained within the angled plug implant region 240. Because the plug enhancement 240 has essentially expanded the active region 212 to contain the layer of silicide 236 as it grows, the layer of silicide 236 does not contact the bulk substrate 214 to create a short circuit which would cause current leakage during operation of the subsequently formed contact.

While the invention may be susceptible to various modifications and alternative forms, specific embodiments have been shown by way of example in the drawings and have been be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a contact in an integrated circuit, the method comprising the steps of:
    (a) forming an active region in a silicon substrate;
    (b) forming a layer of dielectric material over the active region in the substrate;
    (c) forming a contact hole in the layer of dielectric material to expose at least a portion of the active region in the substrate, the contact hole having side walls and a longitudinal axis, and the exposed portion of the substrate forming a bottom surface of the contact hole;
    (d) implanting a dopant at a positive angle relative to the longitudinal axis to form a plug implantation region in the bottom surface of the contact hole which extends into the substrate beneath the dielectric material adjacent the side walls;
    (e) depositing a layer of titanium within the contact hole;
    (f) depositing a layer of titanium nitride over the layer of titanium;
    (g) annealing the substrate to form a layer of titanium silicide on the bottom surface; and
    (h) filling the contact hole with a conductive material.

2. The method, as set forth in claim 1, wherein step (d) comprises the step of:
    rotating the substrate generally about the longitudinal axis.

3. The method, as set forth in claim 1, wherein step (d) comprises the step of:
    implanting the dopant at an angle between 0.1 degrees and 30.0 degrees relative to the longitudinal axis.

4. The method, as set forth in claim 1, wherein step (d) comprises the step of:
    implanting the dopant at multiple positive angles relative to the longitudinal axis.

5. The method, as set forth in claim 1, wherein step (g) comprises the step of:
    completely containing the layer of titanium silicide within the plug implantation region.

6. The method, as set forth in claim 1, further comprising the step of:
    implanting a dopant along the longitudinal axis to form at least a portion of the plug implantation region in the bottom surface of the contact hole.

7. A method of forming a contact in an integrated circuit, the method comprising the steps of:
    (a) forming a contact hole in a material, the contact hole having side walls and a bottom surface;
    (b) implanting a dopant to form a plug implantation region in the side walls and in the bottom surface of the contact hole; and
    (c) filling the contact hole with a conductive material.

8. The method, as set forth in claim 7, wherein step (b) comprises the step of:
    implanting the dopant at a positive angle relative to a longitudinal axis of the contact hole.

9. The method, as set forth in claim 7, wherein step (b) comprises the step of:
    rotating the substrate.

10. The method, as set forth in claim 7, wherein step (b) comprises the step of:

implanting the dopant at an angle between 0.1 degrees and 30.0 degrees relative to a longitudinal axis of the contact hole.

11. The method, as set forth in claim 7, wherein step (b) comprises the step of:

implanting the dopant at multiple positive angles relative to a longitudinal axis of the contact hole.

12. The method, as set forth in claim 7, further comprising the step of:

forming a layer of silicide on the bottom surface.

13. The method, as set forth in claim 12, wherein the step of forming a layer of silicide comprises the step of:

completely containing the layer of silicide within the plug implantation region.

14. The method, as set forth in claim 7, further comprising the step of:

implanting a dopant along a longitudinal axis of the contact hole to form at least a portion of the plug implantation region in the bottom surface of the contact hole.

15. A method of forming a contact in an integrated circuit, the method comprising the steps of:

(a) forming a contact hole in a material, the contact hole having side walls, a bottom surface, and a longitudinal axis;

(b) implanting a dopant at a positive angle relative to the longitudinal axis to form a plug implantation region in the bottom surface of the contact hole which extends into a substrate beneath the side walls; and (c) filling the contact hole with a conductive material.

16. The method, as set forth in claim 15, wherein step (b) comprises the step of:

rotating the substrate.

17. The method, as set forth in claim 15, wherein step (b) comprises the step of:

implanting the dopant at an angle between 0.1 degrees and 30.0 degrees relative to the longitudinal axis.

18. The method, as set forth in claim 15, wherein step (b) comprises the step of:

implanting the dopant at multiple positive angles relative to the longitudinal axis.

19. The method, as set forth in claim 15, further comprising the step of:

forming a layer of silicide on the bottom surface.

20. The method, as set forth in claim 19, wherein the layer of silicide is completely contained within the plug implantation region.

21. The method, as set forth in claim 15, further comprising the step of:

implanting a dopant along the longitudinal axis to form at least a portion of the plug implantation region in the bottom surface of the contact hole.

22. A method of forming a contact in an integrated circuit, the method comprising the steps of:

(a) forming a layer of dielectric material over a substrate;

(b) forming a contact hole in the layer of dielectric material to expose at least a portion of the substrate, the contact hole having side walls and a longitudinal axis, and the exposed portion of the substrate forming a bottom surface of the contact hole;

(c) implanting a dopant at a positive angle relative to the longitudinal axis to form a plug implantation region in the bottom surface of the contact hole which extends into the substrate beneath the layer of dielectric material adjacent the side walls;

(d) forming a layer of barrier material within the contact hole; and (e) filling the contact hole with a conductive material.

23. The method, as set forth in claim 22, wherein step (c) comprises the step of:

rotating the substrate generally about the longitudinal axis.

24. The method, as set forth in claim 22, wherein step (c) comprises the step of:

implanting the dopant at an angle between 0.1 degrees and 30.0 degrees relative to the longitudinal axis.

25. The method, as set forth in claim 22, wherein step (c) comprises the step of.

implanting the dopant at multiple positive angles relative to the longitudinal axis.

26. The method, as set forth in claim 22, wherein step (d) comprises the step of:

forming the layer of barrier material on the bottom surface.

27. The method, as set forth in claim 26, wherein the layer of barrier material is completely contained within the plug implantation region.

28. The method, as set forth in claim 22, further comprising the step of:

implanting a dopant along the longitudinal axis to form at least a portion of the plug implantation region in the bottom surface of the contact hole.

29. A method of forming a contact in an integrated circuit, the method comprising the steps of:

(a) forming an active region in a silicon substrate;

(b) forming a field implant region in the silicon substrate adjacent the active region;

(c) forming a field oxide region over the field implant region;

(d) forming a layer of dielectric material over the field oxide region and over the active region;

(e) forming a contact hole in the layer of dielectric material to expose a portion of the active region, a portion of the field oxide region, and a portion of the field implant region, the contact hole having side walls, a bottom surface, and a longitudinal axis;

(f) implanting a dopant at a positive angle relative to the longitudinal axis to form a plug implantation region in the bottom surface of the contact hole which extends into the substrate beneath dielectric material adjacent the side walls;

(g) forming a layer of silicide on the bottom surface of the contact hole, the layer of silicide being completely contained within the plug implantation region; and (h) filling the contact hole with a conductive material.

30. The method, as set forth in claim 29, wherein step (f) comprises the step of:

rotating the substrate generally about the longitudinal axis.

31. The method, as set forth in claim 29, wherein step (f) comprises the step of:

implanting the dopant at an angle between 0.1 degrees and 30.0 degrees relative to the longitudinal axis.

32. The method, as set forth in claim 29, wherein step (f) comprises the step of:

implanting the dopant at multiple positive angles relative to the longitudinal axis.

33. The method, as set forth in claim 29, wherein step (g) comprises the steps of:

depositing a layer of titanium within the contact hole; and annealing the substrate to form a layer of titanium silicide on the bottom surface.

34. The method, as set forth in claim 33, wherein the layer of titanium silicide is completely contained within the plug implantation region.

35. The method, as set forth in claims 29, further comprising the step of:

implanting a dopant along the longitudinal axis to form at least a portion of the plug implantation region in the bottom surface of the contact hole.

36. A method of forming a contact in an integrated circuit, the method comprising the steps of:

(a) forming an active region in a silicon substrate;

(b) forming a layer of dielectric material over the active region;

(c) forming a contact hole passing through the layer of dielectric material and partially through the active region, the contact hole having side walls, a bottom surface, and a longitudinal axis;

(d) implanting a dopant at a positive angle relative to the longitudinal axis to form a plug implantation region in the bottom surface of the contact hole which extends into the substrate beneath the side walls;

(e) forming a layer of silicide on the bottom surface of the contact hole; and (f) filling the contact hole with a conductive material.

37. The method, as set forth in claim 36, wherein step (d) comprises the step of:

rotating the substrate generally about the longitudinal axis.

38. The method, as set forth in claim 36, wherein step (d) comprises the step of:

implanting the dopant at an angle between 0.1 degrees and 30.0 degrees relative to the longitudinal axis.

39. The method, as set forth in claim 36, wherein step (d) comprises the step of:

implanting the dopant at multiple positive angles relative to the longitudinal axis.

40. The method, as set forth in claim 36, wherein step (e) comprises the steps of:

depositing a layer of titanium within the contact hole; and annealing the substrate to form a layer of titanium silicide on the bottom surface.

41. The method, as set forth in claim 40, wherein the layer of titanium silicide is completely contained within the plug implantation region.

42. The method, as set forth in claim 36, further comprising the step of:

implanting a dopant along the longitudinal axis to form at least a portion of the plug implantation region in the bottom surface of the contact hole.

* * * * *